United States Patent [19]
Economikos et al.

[11] Patent Number: 5,904,868
[45] Date of Patent: May 18, 1999

[54] MOUNTING AND/OR REMOVING OF COMPONENTS USING OPTICAL FIBER TOOLS

[75] Inventors: Laertis Economikos; Robert Hannon; Charles Joseph Hendricks, all of Wappingers Falls; Richard Philip Surprenant, Poughkeepsie, all of N.Y.

[73] Assignee: International Business Machines Corporation, Armonk, N.Y.

[21] Appl. No.: 08/927,159

[22] Filed: Sep. 11, 1997

Related U.S. Application Data

[63] Continuation of application No. 08/751,586, Nov. 12, 1996, abandoned, which is a continuation of application No. 08/260,596, Jun. 16, 1994, abandoned.

[51] Int. Cl.$^6$ ................................................. B23K 26/00
[52] U.S. Cl. .............................. 219/121.63; 219/121.64; 219/121.77
[58] Field of Search ........................... 219/121.61, 121.6, 219/121.63, 121.64, 121.65, 121.66, 121.77, 121.78, 121.85; 228/111.5, 1.1, 6.2

[56] References Cited

U.S. PATENT DOCUMENTS

| | | |
|---|---|---|
| 3,304,403 | 2/1967 | Harper . |
| 3,463,898 | 8/1969 | Takoaka et al. . |
| 3,534,462 | 10/1970 | Cruickshank et al. . |
| 3,614,832 | 10/1971 | Chance et al. . |
| 3,622,743 | 11/1971 | Muncheryan . |
| 3,942,878 | 3/1976 | Engel et al. . |
| 4,534,811 | 8/1985 | Ainslie et al. . |
| 4,676,586 | 6/1987 | Jones et al. . |
| 4,707,073 | 11/1987 | Kocher . |
| 4,893,742 | 1/1990 | Bullock . |
| 4,894,509 | 1/1990 | Chalco et al. ...................... 219/121.6 |
| 4,908,938 | 3/1990 | Thorwarth et al. ...................... 29/846 |
| 4,912,843 | 4/1990 | Dederer .................................... 29/846 |
| 4,963,714 | 10/1990 | Adamski et al. .................. 219/121.63 |
| 4,970,365 | 11/1990 | Chalco .............................. 219/121.63 |
| 5,021,630 | 6/1991 | Benko et al. ...................... 219/121.64 |
| 5,079,070 | 1/1992 | Chalco et al. .......................... 428/209 |
| 5,193,732 | 3/1993 | Interrante et al. ...................... 228/1.1 |
| 5,272,310 | 12/1993 | Diakuzono ........................ 219/121.64 |
| 5,289,632 | 3/1994 | Chalco et al. ............................ 29/846 |
| 5,298,715 | 3/1994 | Chalco et al. .................... 219/121.64 |
| 5,359,203 | 10/1994 | Hashii et al. . |

FOREIGN PATENT DOCUMENTS

| | | |
|---|---|---|
| 57-193290 | 11/1982 | Japan . |
| 58-209493 | 12/1983 | Japan . |
| 60-37284 | 2/1985 | Japan . |
| 61-219467 | 9/1986 | Japan . |
| 5-161988 | 6/1993 | Japan . |
| 6-218534 | 8/1994 | Japan ............................... 219/121.63 |

*Primary Examiner*—Gregory Mills
*Attorney, Agent, or Firm*—Aziz M. Ahsan

[57] ABSTRACT

A laser tool for securing or removing a component from a semiconductor substrate includes a light-transmissive bonding tip having an opening to accommodate a central portion of the component inner and outer walls of the tip being coated with a light reflective material, a portion of the end of the tip being coated with a light absorptive material, so that peripheral areas of the component are locally heated by the tip to mount or remove the component.

60 Claims, 2 Drawing Sheets

MOUNTING AND/OR REMOVING OF COMPONENTS USING OPTICAL FIBER TOOLS

CROSS-REFERENCE TO RELATED PATENT APPLICATION

The application is a continuation of application Ser. No. 08/751,586, filed Nov. 12, 1996, now abandoned, which is a Continuation patent application of U.S. patent application Ser. No. 08/260,596, which was filed on Jun. 16, 1994, now abandoned.

FIELD OF THE INVENTION

The present invention relates generally to a new apparatus and method for mounting and/or removing of components using optical fiber tools. More particularly, the invention encompasses an apparatus and method for mounting and/or removing of electronic parts using an optical fiber tool. Additionally, a method and an apparatus for repairing pins and electronic components using optical fiber tools is also disclosed.

BACKGROUND OF THE INVENTION

Semiconductor devices are becoming smaller and more dense with the evolution of new technology. However, increases in circuit density produce a corresponding increase in overall increase in chip I/O (input/output) density. Chip and substrate manufacturers are therefore constantly challenged to improve the quality of their products. One way of doing this is by identifying and eliminating defects and another way is to be able to remove these defective parts without having an adverse impact on the other components. Similarly, these manufacturers are also constantly challenged to produce components that can be readily mounted and removed from an electronic part, such as a substrate. Whereas significant improvements are being made in this regard but there is more that needs to be done.

Process improvements alone are not sufficient to eliminate all the random defects which effect both yield and reliability. Historically, screening techniques have been employed to improve product failure rates to acceptable levels by culling out many of these random defects.

Additionally, within the industry, and particularly within the semiconductor industry there is also a need to make reliable electrical connections. And, therefore it is very important that these electrical interconnects be extremely reliable before they reach the end user. This reliability is also becoming important as the electrical interconnect grids are being tighter or closer.

This and other similar issues have been addressed by the semiconductor industry in a variety of ways, for example, U.S. Pat. No. 3,534,462 (Cruickshank, et al.) disclosed a method for simultaneous multiple lead bonding. A composite cylindrical lens is used to provide the necessary beam of radiant energy to simultaneously bond the leads.

U.S. Pat. No. 3,614,832 (Chance, et al.), discloses a variety of methods to make electrical connections. For example, it discloses the use of a thermo-compression bonder that penetrates a decal backing sheet and an adhesive layer depress a strip into a contact to form an electrical contact. Another method disclosed is using a heated ultrasonic tip to make the electrical connection. The use of laser in which an energy beam is focused by means of a lens system to form the electrical connection is also disclosed.

U.S. Pat. No. 4,893,742 (Bullock), discloses an ultrasonic laser soldering system, where a bonding tool having an elongated hollow capillary which is used to firmly and securely hold an end portion of a optical fiber. A laser beam is transmitted to the end of the optical fiber to secure an electrical lead to a pad on a substrate.

U.S. Pat. No. 4,970,365 (Chalco) discloses a method and apparatus for bonding components leads to pads located on a non-rigid substrate. Energy from a laser is provided along an optical fiber into the tip, such that the laser energy is reflected by and absorbed at the wall of the cavity in the tip and thereby the frontal region and frontal surface of the tip is heated. This heated tip is then used to secure an electrical lead to a pad on a substrate. Also disclosed is an ultrasonic welding apparatus or bonder that is coupled to a horn or resonator for coupling reciprocating vibratory motion from the bonder to the bonding tip having the optical fiber.

U.S. Pat. No. 5,079,070 (Chalco, et al.) discloses repair of open defects in thin film conductors. This patent utilizes the inventive lasersonic bonding apparatus of the above-mentioned U.S. Pat. No. 4,970,365, to make the repairs of the open defects in thin film conductors.

U.S. Pat. No. 5,289,632 (Chalco, et al.) discloses a bonding tip that may be pencil-like shape. An optical fiber is centrally located within the bonding tip. In order to prevent energy loss from the bottom end of the bonding tip and to create a highly-efficient laser-beam trap, a capping layer is included to provide a seal thereat. The capping layer preferably covers the entire footprint of the bottom end of the bonding tip, and can be integrally attached to or deposited on the bottom end by means already known in the prior art.

Bond reliability has greatly been improved as a result of the absence of solder and the fact that only three parameters control the bonding process. The three parameters are tip pressure, laser power and bonding time. In order to achieve bonding rates comparable to that achieved when gang bonding, a highly controllable laser heating pulse and a fast X-Y stepper such as currently in use in wire bonding applications are combined to achieve bonding rates in order of 50 to 100 milliseconds per bond.

The present invention also solves the problem of achieving reliable solderless bonds with bare-copper pads without resultant heat damage by bonding the lead to the pad using either laser energy or using a combination of laser energy and ultrasonic energy.

The apparatus and method of the present invention results in a tool or apparatus that provides a unique optical fiber tool for mounting and/or removing of components from a semiconductor module and/or substrate.

Furthermore, the present invention is very inexpensive compared to the prior known units, which require expensive complicated mechanical connectors or probes for forming electrical contacts.

PURPOSES AND SUMMARY OF THE INVENTION

The invention is a novel method and an apparatus for providing optical fiber tools that is used to mount and/or remove components off of semiconductor modules or substrates.

Therefore, one purpose of this invention is to provide an apparatus and a method that will provide a high reliability electrical interconnect.

Another purpose of this invention is to provide an optical sleeve that acts as a bonding tip.

Yet another purpose of this invention is to have an optical bonding sleeve that has a partial coating of a reflective material and a partial coating of a non-reflective material.

Still yet another purpose of this invention is to provide an optical tool for mounting or removing of I/O pins from a semiconductor substrate or module.

Yet another purpose of this invention is to have a simple design which allows for a variety of cost effective manufacturing techniques.

Still yet another purpose of this invention is to provide a high heat concentration at tip of the tool so as to provide a reliable electrical connection.

Still yet another purpose of the invention is to have a probe or tool that can be reworked and/or repaired easily.

Yet another purpose of this invention is to provide an optical tool for mounting or removing surface mount resistors and/or capacitors from a semiconductor module or a substrate.

Therefore, in one aspect this invention comprises a tool for securing or removing at least one component from a semiconductor substrate comprising, (a) a first end, a second end, an inner wall and an outer wall, (b) at least a portion of said first end has at least one coating of at least one energy absorbing material, (c) said second end having means to interface with at least one optical fiber, (d) at least a portion of said inner wall and said outer wall having at least one coating of at least one light reflective material, such that when a laser beam enters said tool through said at least one optical fiber it is reflected from at least a portion of said inner and said outer walls and is absorbed by said first end of said tool and thereby heating said first end which is used to securely mount or remove said component from said substrate.

In another aspect this invention comprises a tool for securing or removing at least one component from a semiconductor substrate comprising, (a) a first end, a second end, an inner wall and an outer wall, (b) at least a portion of said first end having at least one leg, and wherein at least a portion of said at least one leg has at least one coating of at least one energy absorbing material, (c) at least a portion of said second end having means to interface with at least one optical fiber, (d) at least a portion of said inner wall and said outer wall having at least one coating of at least one light reflective material, such that when a laser beam enters said tool through said at least one optical fiber it is reflected from at least a portion of said inner and said outer walls and is absorbed by at least a portion of at least one leg of said first end of said tool and thereby heating said at least one leg which is used to securely mount or remove said at least one component from said substrate.

In yet another aspect the invention comprises of a tool for securing or removing at least one component from a semiconductor substrate comprising, (a) a first end, a second end, an inner wall and an outer wall, (b) at least a portion of said first end having at least one leg, and wherein at least a portion of said at least one leg has at least one coating of at least one energy absorbing material, (c) at least a portion of said second end having means to interface with at least one optical fiber, (d) at least a portion of said at least one optical fiber is routed to discharge a laser beam into at least a portion of said at least one energy absorbing material in said at least one leg, such that when said laser beam enters said tool through said at least one optical fiber it is absorbed by at least a portion of at least one leg of said first end of said tool and thereby heating said at least one leg which is used to securely mount or remove said at least one component from said substrate.

In still another aspect the invention comprises of a method for securing or removing at least one component from a semiconductor substrate comprising, (a) a tool having an optical sleeve, said optical sleeve has a first end, a second end, an inner wall and an outer wall, (b) wherein at least a portion of said first end is coated with at least one coating of at least one energy absorbing material, (c) wherein said second end is provided with at least one means to interface with at least one optical fiber, (d) wherein at least a portion of said inner wall and said outer wall is coated with at least one coating of at least one light reflective material, such that when a laser beam enters said tool through said at least one optical fiber it is reflective off from at least a portion of said inner and said outer walls and is absorbed by said first end of said tool and thereby heating said first end which is used to securely mount or remove said component from said substrate.

In still yet another aspect the invention comprises of a method for securing or removing at least one component from a semiconductor substrate comprising, (a) a tool having an optical sleeve, said optical sleeve has at least two legs, said legs have a first end, a second end, an inner wall and an outer wall, (b) wherein at least a portion of said first end is coated with at least one coating of at least one energy absorbing material, (c) wherein said second end is provided with at least one means to interface with at least one optical fiber, (d) wherein at least a portion of said inner wall and said outer wall is coated with at least one coating of at least one light reflective material, such that when a laser beam enters said tool through said at least one optical fiber it is reflective off from at least a portion of said inner and said outer walls and is absorbed by said first end of said tool and thereby heating said first end which is used to securely mount or remove said component from said substrate.

In still yet another aspect the invention comprises of a method for securing or removing at least one component from a semiconductor substrate comprising, (a) a tool having a first end, a second end, an inner wall and an outer wall, (b) wherein at least a portion of said first end is coated with at least one coating of at least one energy absorbing material, (c) wherein said second end is provided with at least one means to interface with at least one optical fiber, (d) said at least one optical fiber is routed through said tool to terminate at said first end, such that when a laser beam enters said tool through said at least one optical fiber it is absorbed by said first end of said tool and thereby heating said first end which is used to securely mount or remove said at least one component from said substrate.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Temporary or permanent electrical interconnection for electronic circuits continue to grow in importance as contact densities increase. Current trends on chips, modules and cards/boards are pushing the limits of available technology.

The invention described here provides a highly variable tool that can be adapted to a large variety of requirements, such as, but not limited to, size, compliance, force required, material selection, configuration, etc.

Some of the industrial applications for which this system can be readily used, includes, but not limited to, wire or lead bonding and other types of electrical interconnections. Bonding as used herein includes both electrical as well as mechanical type bonding.

Figure 1:
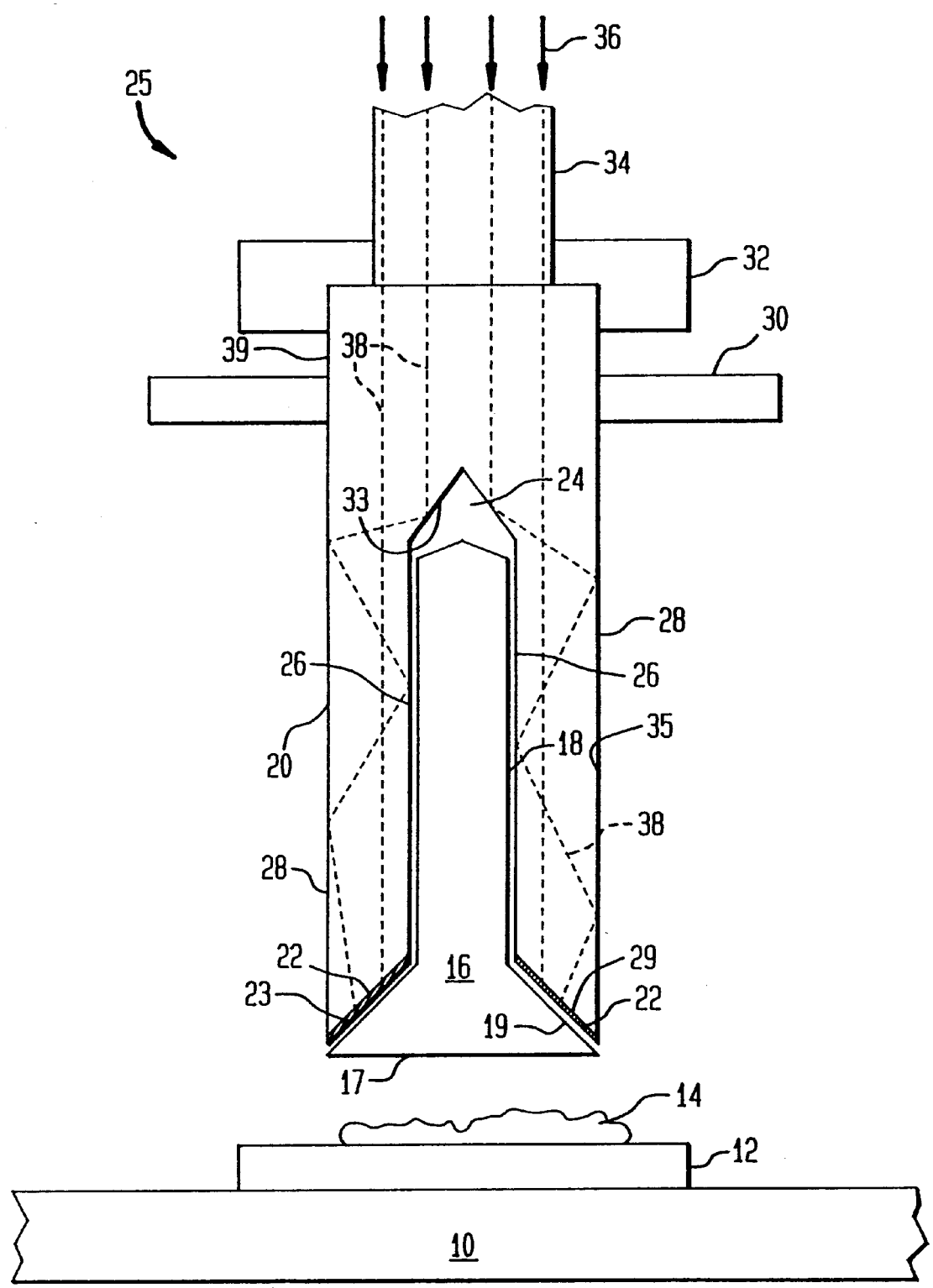
FIG. 1, illustrates one preferred embodiment of this invention for mounting and/or removing pins.

The preferred embodiment of the invention is illustrated in FIG. 1, where an optical bonding tool or apparatus 25, has at least one fiber optic cable 34, coupled to an end 39, of a bonding tip or an optical sleeve 20. The bonding tip 20, is shaped such that it snugly fits over a component 16, such as for example, an I/O (input/output) pin 16.

The bonding tip or the optical sleeve 20, has one first end 29, a second end 39, an inner wall 26, and an outer wall 28. The first end 29, of the optical sleeve 20, or the bonding tip 20, has at least one coating of at least one non-reflective or energy absorbing material 22. The second end 39, of the optical sleeve 20, or the bonding tip 20, is configured to interface through an optical coupling device 32, with at least one fiber optic cable 34. The optical fiber 34, brings the laser or optical energy 36, to the bonding tip 20. The ends of the fiber optic cable 34, typically terminate in the coupling device 32, or at the second end 39, of the optical sleeve 20.

At least a portion of both the inner wall 26, and the outer wall 28, of the optical sleeve 20, should have at least one coating of at least one light reflective material 33 and 35, respectively. The reflective material 33, could be the same as reflective material 35, or it could be different. Similarly, different layers of reflective material 33 and 35, could be applied on the inner wall 26, and the outer wall 28. The reflective material 33 and 35, could be selected from a group comprising of materials depending upon the wavelength of the laser used, for example, if a $CO_2$ laser is used then copper can be used as the reflective material.

The laser beam 36, is transmitted through the fiber optic cable 34, into the bonding tip 20, where the energy from the laser beam 36, is contained within the optical sleeve 20. As discussed earlier the bonding tip 20, has at least one reflective coating 33 and 35, on the inside and outside walls 26 and 28, respectively, and a non-reflective coating 22, at the first end or bottom or base 29, of the tip 20. Light energy 38, from the laser beam 36, is directed through the optical sleeve 20, to the end or base 29, which gets converted into thermal energy by the absorption of the non-reflective coating 22. Once the bonding base 23, having the coating 22, gets heated it heats the base 17, of the pin 16, which in turn heats the solder or braze material 14, which is on top of an I/O pad 12, on a substrate 10. The melting of the braze material 14, then either joins the pin 16, to the pad 12, or allows the removal of the pin 16, from the pad 12.

The bond tip 20, could be made from a hollow metal and therefore may not require an optical sleeve 20. The heat for such a case is provided directly by the laser energy 38, to the end or base 29, and then into the pin 16, and the braze material 14.

The optical sleeve 20, typically has a blind hole or area 24, that is used to slideabily accommodate portions of structures, such as, for example, the shaft 18, of the pin or electronic component 16. Similarly, at least a portion of the bonding end or base 23, of the optical sleeve 20, should be physically shaped so as to follow at least a portion of the physical contours of an electronic component, such as, for example, the tapered base 19, of the I/O pin 16. For the embodiment shown in FIG. 1, the bonding base 23, of the first end 29, of the optical sleeve 20, basically follows the tapered contour of the upper surface 19, of the base of the pin 16. Furthermore, the blind hole 24, should be such that it helps in making sure that the bonding base 23, makes a physical and direct mechanical contact with the electronic component 16, that needs to be secured to or removed from a module or substrate 10.

For some applications it may be necessary to attach a vibrating means 30, such as an ultrasonic bonder 30, to the tool 25. With this configuration, for example, the pin 16, could be attached directly to the pad 12, without using the braze material 14. In this case both the laser and ultrasonic energies would be applied simultaneously to the pin 16. The pin 16, would then be connected to the pad 12, by a metal to metal diffusion process.

As shown in FIG. 1, the laser beam 36, coming through the fiber optic cable 34, is reflected inside the optical sleeve 20, as shown by numeral 38. The reflected laser beam 38, is eventually absorbed by the non-reflecting or energy absorbing material 22, which then heats up the bonding end 23, to provide the necessary heat to remove or secure the component 16.

Figure 2:
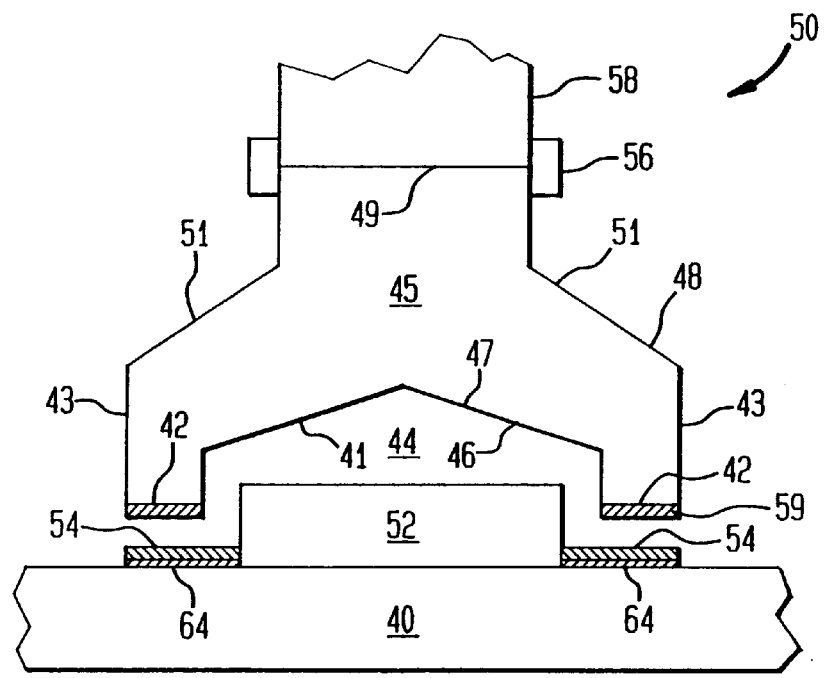
FIG. 2, illustrates another preferred embodiment of this invention for mounting and/or removing electronic components.

FIG. 2, illustrates another preferred embodiment of the present invention. An optical bonding tool 50, has an optical sleeve 45, and an optical coupling device 56, which couples the optical sleeve 45, to at least one fiber optic cable 58. The optical sleeve 45, has a bottom or first end 47, a top or second end 49, an inner wall area 46, and an outer wall area 48. The optical sleeve 45, is shaped to fit over a surface-mounted electronic component 52, such as for example, a capacitor or a chip, to name a few. This shape is achieved by having the optical sleeve 45, having at least one leg 43. The leg 43, extends below the first end 47, creating a space 44, so that the optical bonding sleeve 45, does not make physical contact with the electronic component 52. The optical sleeve 45, has at least one layer of at least one reflective coating 41, on the inner wall 46, and/or at least one layer of at least one reflective coating 51, on the outer wall 48, of the optical sleeve 45, and at least one coating of at least one non-reflective material or energy absorbing material 42, at the end of the legs 43. The coated end 42, of the optical sleeve 45, forms a bonding end 59, which actually contacts the component leads 54. Laser or optical energy is conducted through the optical fiber 58, to the bonding end 59, of the optical sleeve 45. This laser or optical energy is then reflected off the walls 46 and 48, due to the presence of the light reflecting material or coating 41 and 51, respectively, and then the laser or light energy is absorbed by the bonding end 59, which gets thermally heated. The bonding end 59, then transmits this thermal energy to the leads 54, on the electronic component 52, and to the pad 64, on the substrate 40. The component leads 54, can then be securely bonded to the pad 64, by either using a braze or solder material. Similarly, using this inventive tool 50, the component leads 54, could be heated and removed from the pad 64. Additionally, in some cases the lead 54, could be thermosonically bonded to the pad 64, or removed from the pad 64, as discussed earlier, by utilizing a vibrating means 30, as shown and discussed in FIG. 1.

Figure 3:
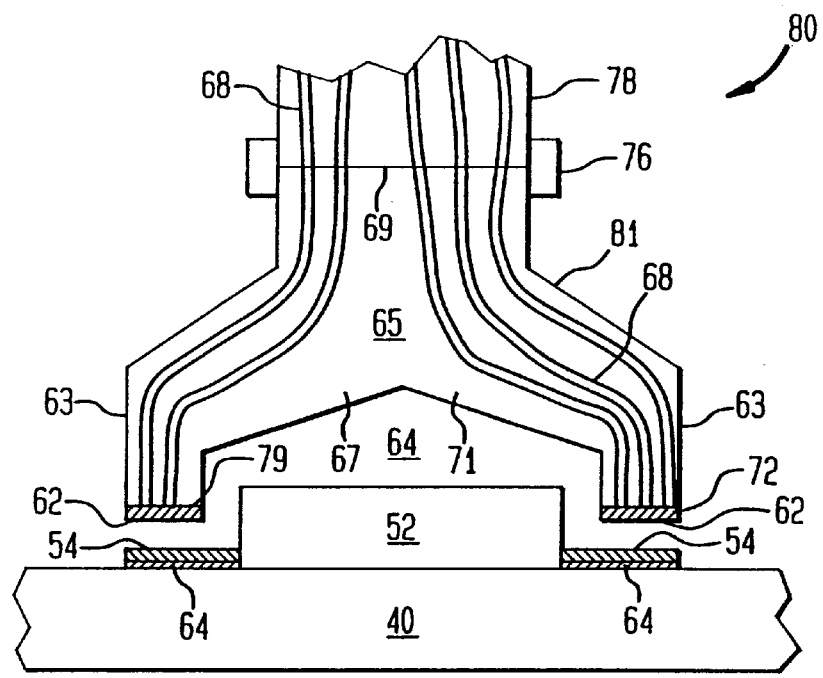
FIG. 3, illustrates yet another preferred embodiment of this invention for mounting and/or removing electronic components.

Still another embodiment of the invention is illustrated in FIG. 3, where a bonding tip 80, having a bonding sleeve 65. The bonding sleeve 65, has a bonding tip end 62, at least one leg 63, a lower or first end 67, and an upper or second end 69. The leg 63, extends below the first end 67, creating a space 64, so that the bonding sleeve 65, does not make physical contact with the electronic component 52. The bonding tip end 62, has at least one coating of at least one energy absorbing material or non-reflective material 72. The bonding sleeve 65, preferably contains multiple fiber optic cables 68, to provide the proper energy density for joining the lead 54, to the pad 64, or removing the lead 54, from the pad 64. The optical fibers 68, basically follow tip's geometry and terminate at or near the vicinity of the bonding tip end location 62. The coated end 62, of the optical sleeve 65, forms a bonding end 79, which actually contacts the component leads 54. Laser or optical energy is conducted through the optical fiber 68, to the bonding end 79, of the sleeve 65. This laser or optical energy is then directed to the energy absorbing material 72, where it is absorbed by the bonding end 79, which gets thermally heated. The bonding end 79, then transmits this thermal energy to the leads 54, on the electronic component 52, and to the pad 64, on the substrate 40. The component leads 54, can then be securely bonded to the pad 64, by either using a braze or solder material. Similarly, using this inventive tool 80, the component leads 54, could be heated and removed from the pad 64. Additionally, in some cases the lead 54, could be thermosonically bonded to the pad 64, or removed from the pad 64, as discussed earlier, by utilizing a vibrating means 30, as shown and discussed in FIG. 1. Once the laser beam is sent through the fiber optical 68, the laser energy goes directly to the non-reflective surfaces 72, and this laser energy thermally heats the bonding tip end 62, for the bonding operation of bonding lead 54, to the pad 64. In this configuration the inner walls 71, and the exterior walls or surfaces 81, do not have to be reflective or have a coating of any reflective material. This is due to the fact that no light is being directed or reflected from these surfaces, as light energy is being carried directly by the optical fiber 68, to the non-reflective or energy absorbing surface or material 72, at the bonding end 79.

For some applications it may be desirable to have an optical coupling device 76, to couple or as an interface between the optical cable sleeve 78, carrying the optical fiber 68, and the sleeve 65.

The bonding tip base which is part of the sleeve of this inventive tool could have at least one coating of at least one energy absorbing material which could typically be selected from a group comprising of materials, depending upon the wavelength of the laser used, for example, if a Nd:YAG laser is used then WC or TiC could be used.

The surface of the optical sleeve of this inventive tool could have at least one coating of at least one light reflective material which could typically be selected from a group comprising of materials, depending upon the wavelength of the laser being used, for example, if a Nd:YAG laser is used then a polished Au surface would be suitable.

The optical tool or probe could be made from any thermally conductive material such as, BeCu, BeNi, Cu or Cu alloys, Fe or Fe alloys, TiC or WC, to name a few, or any other thermally conductive material.

The tool of this invention is typically used for both securing and removing active and/or passive components that are mounted on the surface.

Care should be taken when designing the bonding tip such that it does not adversely interfere with the electronic component that is being mounted or removed. Similarly, the design should be such that the bonding tip directs the light or laser energy away from potentially heat sensitive areas and towards the desired bonding area.

The mounting and repair techniques of the present invention results in an electrically reliable joint which is strong enough to hold the pin or lead in position on a carrier throughout the desired period, but which is weak enough not to cause damage to either the pin or lead or chip or the module or carrier.

The attachment techniques of the present invention are very inexpensive compared to the prior known techniques which required expensive and complicated mechanical connectors or other means for forming less reliable electrical and/or mechanical contacts.

While the present invention has been particularly described, in conjunction with a specific preferred embodiment, it is evident that many -alternatives, modifications and variations will be apparent to those skilled in the art in light of the foregoing description.

It is therefore contemplated that the appended claims will embrace any such alternatives, modifications and variations as falling within the true scope and spirit of the present invention.

What is claimed is:

1. A tool for securing or removing at least one component having a central area and a peripheral area from a semiconductor substrate comprising, (a) a bonding tip having a first end, a second end, an inner wall to accommodate at least a portion of said central area of said at least one component, and an outer wall, and wherein said bonding tip is made from a material that allows the passage of light, (b) at least a portion of said first end having an opening to allow the passage of a portion of said component into said inner wall and further having at least one coating of at least one energy absorbing material, (c) said second end having means to interface with at least one optical fiber, (d) at least a portion of said inner wall and said outer wall having at least one coating of at least one light reflective material, such that when a laser beam enters said tool through said at least one optical fiber it is reflected from at least a portion of said inner and said outer walls and is absorbed by at least a portion of said at least one energy absorbing material at said first end of said tool and thereby locally heating said at least one energy absorbing material at said first end so that at least a portion of said peripheral area of said component is heated, and wherein said portion of said component inside said inner wall is not heated, and such heating securely mounts or removes said component from said substrate.

2. The tool of claim 1, wherein at least a portion of said tool is made from an optically transparent material.

3. The tool of claim 1, wherein at least one means is secured to said tool to vibrate a portion of said tool.

4. The tool of claim 3, wherein said at least one means to vibrate said tool is an ultrasonic bonder.

5. The tool of claim 1, wherein the material for said at least one coat of said at least one energy absorbing material is selected in direct dependence on the wavelength of laser beam used, so as to absorb the laser beam.

6. The tool of claim 1, wherein the material for said at least one coat of said at least one energy absorbing material is WC or TiC for a Nd:YAG laser.

7. The tool of claim 1, wherein the material for said at least one coat of said at least one light reflecting material is selected in direct dependence on the wavelength of laser beam used, so as to reflect the laser beam.

8. The tool of claim 1, wherein the material for said at least one coat of said at least one light reflective material is gold for a Nd:YAG laser or copper for a $CO_2$ laser.

9. The tool of claim 1, wherein said inner wall is configured to slideabily hold the shaft of said component to be secured or removed.

10. The tool of claim 1, wherein said component to be secured or removed is selected from a group comprising I/O pin, lead wire, integrated circuit chip or capacitor.

11. A tool for securing or removing at least one component having a central area and a peripheral area from a semiconductor substrate comprising,
(a) a bonding tip having a first end, a second end, an inner wall to accommodate at least a portion of said central area of said at least one component, and an outer wall, and wherein said bonding tip is made from a material that allows the passage of light,
(b) at least a portion of said first end having at least two legs, and wherein at least a portion of at least one leg has at least one coating of at least one energy absorbing material,
(c) at least a portion of said second end having means to interface with at least one optical fiber,
(d) at least a portion of said inner wall and said outer wall having at least one coating of at least one light reflective material, such that when a laser beam enters said tool through said at least one optical fiber it is reflected from at least a portion of said inner and said outer walls and is absorbed by at least a portion of said at least one energy absorbing material at said at least one leg of said first end of said tool and thereby locally heating said at least one energy absorbing material at said at least one leg so that at least a portion of said peripheral area of said component is heated, and wherein said central area of said component is not heated, to securely mount or remove said at least one component from said substrate.

12. The tool of claim 11, wherein at least a portion of said tool is made from an optically transparent material.

13. The tool of claim 11, wherein at least one means is secured to said tool to vibrate a portion of said tool.

14. The tool of claim 13, wherein said at least one means to vibrate said tool is an ultrasonic bonder.

15. The tool of claim 11, wherein the material for said at least one coat of said at least one energy absorbing material is selected in direct dependence on the wavelength of laser beam used, so as to absorb the laser beam.

16. The tool of claim 11, wherein the material for said at least one coat of said at least one energy absorbing material is WC or TiC for a Nd:YAG laser.

17. The tool of claim 11, wherein the material for said at least one coat of said at least one light reflecting material is selected in direct dependence on the wavelength of laser beam used, so as to reflect the laser beam.

18. The tool of claim 11, wherein the material for said at least one coat of said at least one light reflective material is gold for a Nd:YAG laser or copper for a $CO_2$ laser.

19. The tool of claim 11, wherein said inner wall is configured to physically accommodate said component to be secured or removed.

20. The tool of claim 11, wherein said component to be secured or removed is selected from a group comprising I/O pin, lead wire, integrated circuit chip or capacitor.

21. A tool for securing or removing at least one component having a central area and a peripheral area from a semiconductor substrate comprising,
(a) a first end, a second end, an inner wall to accommodate at least a portion of said central area of said at least one component, and an outer wall,
(b) at least a portion of said first end having at least one leg, and wherein at least a portion of said at least one leg has at least one coating of at least one energy absorbing material,
(c) at least a portion of said second end having at least one opening to accommodate at least one optical fiber,
(d) at least a portion of said at least one optical fiber is routed through said second end to said first end to discharge a laser beam directly into at least a portion of said at least one energy absorbing material in said at least one leg, such that when said laser beam enters said tool through said at least one optical fiber it is absorbed by at least a portion of said at least one energy absorbing material at said at least one leg of said first end of said tool and thereby locally heating said at least one energy absorbing material at said at least one leg so that at least a portion of said peripheral area of said component is heated, and wherein said central area of said component is not heated, to securely mount or remove said at least one component from said substrate.

22. The tool of claim 21, wherein at least a portion of said tool is made from an optically transparent material.

23. The tool of claim 21, wherein at least one means is secured to said tool to vibrate a portion of said tool.

24. The tool of claim 23, wherein said at least one means to vibrate said tool is an ultrasonic bonder.

25. The tool of claim 21, wherein the material for said at least one coat of said at least one energy absorbing material is selected in direct dependence on the wavelength of laser beam used, so as to absorb the laser beam.

26. The tool of claim 21, wherein the material for said at least one coat of said at least one energy absorbing material is WC or TiC for a Nd:YAG laser.

27. The tool of claim 21, wherein the material for said at least one coat of said at least one light reflecting material is selected in direct dependence on the wavelength of laser beam used, so as to reflect the laser beam.

28. The tool of claim 21, wherein the material for said at least one coat of said at least one light reflective material is gold for a Nd:YAG laser or copper for a $CO_2$ laser.

29. The tool of claim 21, wherein said inner wall is configured to physically accommodate said component to be secured or removed.

30. The tool of claim 21, wherein said component to be secured or removed is selected from a group comprising I/O pin, lead wire, integrated circuit chip or capacitor.

31. A method for securing or removing at least one component having a central area and a peripheral area from a semiconductor substrate comprising, (a) using a tool having an optical sleeve, said optical sleeve has a first end, a second end, an inner wall to accommodate at least a portion of said central area of said at least one component, and an outer wall, and wherein said optical sleeve is made from a material that allows the passage of light, (b) wherein at least a portion of said first end having an opening to allow the passage of a portion of said component into said inner wall and further having at least one coating of at least one energy absorbing material, (c) providing said second end with at least one means to interface with at least one optical fiber, (d) coating at least a portion of said inner wall and said outer wall with at least one coating of at least one light reflective material, such that when a laser beam enters said tool at said second end through said at least one optical fiber it is reflected off from at least a portion of said inner and said outer walls and is absorbed by at least a portion of said at least one energy absorbing material at said first end of said tool and thereby locally heating said at least one energy absorbing material at said first end so that at least a portion of said peripheral area of said component is heated, and wherein said portion of said component inside said inner wall is not heated, to securely mount or remove said component from said substrate.

32. The method of claim 31, wherein at least a portion of said tool is made from an optically transparent material.

33. The method of claim 31, wherein at least one means is secured to said tool to vibrate a portion of said tool.

34. The method of claim 33, wherein said at least one means to vibrate said tool is an ultrasonic bonder.

35. The method of claim 31, wherein the material for said at least one coat of said at least one energy absorbing material is selected in direct dependence on the wavelength of laser beam used, so as to absorb the laser beam.

36. The method of claim 31, wherein the material for said at least one coat of said at least one energy absorbing material is WC or TiC for a Nd:YAG laser.

37. The method of claim 31, wherein the material for said at least one coat of said at least one light reflecting material is selected in direct dependence on the wavelength of laser beam used, so as to reflect the laser beam.

38. The method of claim 31, wherein the material for said at least one coat of said at least one light reflective material is gold for a Nd:YAG laser or copper for a $CO_2$ laser.

39. The method of claim 31, wherein said inner wall is configured to slideabily hold the shaft of said component to be secured or removed.

40. The method of claim 31, wherein said component to be secured or removed is selected from a group consisting of I/O pin, lead wire, integrated circuit chip or capacitor.

41. A method for securing or removing at least one component having a central area and a peripheral area from a semiconductor substrate comprising, (a) using a tool having an optical sleeve, said optical sleeve has at least two legs, said legs have a first end, a second end, an inner wall to accommodate at least a portion of said central area of said at least one component, and an outer wall, and wherein said optical sleeve is made from a material that allows the passage of light, (b) coating at least a portion of said first end with at least one coating of at least one energy absorbing material, (c) providing said second end with at least one means to interface with at least one optical fiber, (d) coating at least a portion of said inner wall and said outer wall with at least one coating of at least one light reflective material, such that when a laser beam enters said tool through said at least one optical fiber it is reflective off from at least a portion of said inner and said outer walls and is absorbed by at least a portion of said at least one energy absorbing material at said first end of said tool and thereby locally heating said at least one energy absorbing material at said first end so that at least a portion of said peripheral area of said component is heated, and wherein said central area of said component is not heated, to securely mount or remove said component from said substrate.

42. The method of claim 41, wherein at least a portion of said tool is made from an optically transparent material.

43. The method of claim 41, wherein at least one means is secured to said tool to vibrate a portion of said tool.

44. The method of claim 43, wherein said at least one means to vibrate said tool is an ultrasonic bonder.

45. The method of claim 41, wherein the material for said at least one coat of said at least one energy absorbing material is selected in direct dependence on the wavelength of laser beam used, so as to absorb the laser beam.

46. The method of claim 41, wherein the material for said at least one coat of said at least one energy absorbing material is WC or TiC for a Nd:YAG laser.

47. The method of claim 41, wherein the material for said at least one coat of said at least one light reflecting material is selected in direct dependence on the wavelength of laser beam used so as to reflect the laser beam.

48. The method of claim 41, wherein the material for said at least one coat of said at least one light reflective material is gold for a Nd:YAG laser or copper for a $CO_2$ laser.

49. The method of claim 41, wherein said inner wall is configured to physically accommodate said component to be secured or removed.

50. The method of claim 41 wherein said component to be secured or removed is selected from a group consisting of I/O pin, lead wire, integrated circuit chip or capacitor. one energy absorbing material at said first end to securely mount or remove said at least one component from said substrate.

51. A method for securing or removing at least one component having a central area and a peripheral area from a semiconductor substrate comprising, (a) using a tool having a first end, a second end, an inner wall to accommodate at least a portion of said central area of said at least one component, and an outer wall, (b) coating at least a portion of said first end with at least one coating of at least one energy absorbing material, (c) providing said second end with at least one opening to accommodate at least one optical fiber, (d) routing, said at least one optical fiber through said second end to said first end to terminate at said first end, such that when a laser beam enters said at least one optical fiber it is directly absorbed by at least a portion of said at least one energy absorbing material at said first end of said tool and thereby locally heating said at least one energy absorbing material at said first end so that at least a portion of said peripheral area of said component is heated, and wherein said central area of said component is not heated, to securely mount or remove said at least one component from said substrate.

52. The method of claim 51, wherein at least a portion of said tool is made from an optically transparent material.

53. The method of claim 51, wherein at least one means is secured to said tool to vibrate a portion of said tool.

54. The method of claim 53, wherein said at least one means to vibrate said tool is an ultrasonic bonder.

55. The method of claim 51, wherein the material for said at least one coat of said at least one energy absorbing material is selected in direct dependence on the wavelength of laser beam used, so as to absorb the laser beam.

56. The method of claim 51, wherein the material for said at least one coat of said at least one energy absorbing material is WC or TiC for a Nd:YAG laser.

57. The method of claim 51, wherein the material for said at least one coat of said at least one light reflecting material is selected in direct dependence on the wavelength of laser beam used, so as to reflect the laser beam.

58. The method of claim 51, wherein the material for said at least one coat of said at least one light reflective material is gold for a Nd:YAG laser or copper for a $CO_2$ laser.

59. The method of claim 51, wherein said inner wall is configured to physically accommodate said component to be secured or removed.

60. The method of claim 51, wherein said component to be secured or removed is selected from a group consisting of I/O pin, lead wire, integrated circuit chip or capacitor.

* * * * *